United States Patent
Sakuma et al.

(10) Patent No.: US 7,317,362 B2
(45) Date of Patent: Jan. 8, 2008

(54) OSCILLATOR CIRCUIT AND OSCILLATION CONTROL METHOD

(75) Inventors: Katsuya Sakuma, Atsugi (JP); Akira Ikeuchi, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 22 days.

(21) Appl. No.: 11/313,134

(22) Filed: Dec. 20, 2005

(65) Prior Publication Data
US 2006/0208812 A1    Sep. 21, 2006

(30) Foreign Application Priority Data
Mar. 15, 2005    (JP) .............................. 2005-073887

(51) Int. Cl.
*H03K 3/26* (2006.01)
(52) U.S. Cl. .................... 331/111; 331/46; 331/55; 331/143; 331/2; 327/72; 327/131; 327/156; 327/137; 327/141; 327/163
(58) Field of Classification Search .................. 331/46, 331/111, 2, 55, 143; 327/72, 131, 137, 156, 327/141, 163
See application file for complete search history.

(56) References Cited

U.S. PATENT DOCUMENTS 5,097,226 A * 3/1992 Pascucci et al. ............... 331/46

* cited by examiner

*Primary Examiner*—Arnold Kinkead
(74) *Attorney, Agent, or Firm*—Ladas & Parry LLP

(57) ABSTRACT

An oscillator circuit is disclosed that includes a first oscillation part configured to output a first oscillation output by charging and discharging a first capacitor, and a second oscillation part configured to output a second oscillation output by charging and discharging a second capacitor. The second oscillation part includes a phase difference detection part configured to detect the phase difference between the first oscillation output and the second oscillation output, and a charging current and discharge current control part configured to control the charging current and the discharge current of the second capacitor in accordance with the phase difference detected by the phase difference detection part so that the second oscillation output synchronizes with the first oscillation output.

4 Claims, 5 Drawing Sheets

FIG.4

| FIN | VOSIN | OUT |
|---|---|---|
| L→H | L | H |
| H | L→H | ZH |
| L | L→H | L |
| L→H | H | ZH |

US 7,317,362 B2

OSCILLATOR CIRCUIT AND OSCILLATION CONTROL METHOD

BACKGROUND OF THE INVENTION

1. Field of the Invention

The present invention relates generally to oscillator circuits and oscillation control methods, and more particularly to an oscillator circuit that oscillates by charging and discharging a capacitor and an oscillation control method for controlling oscillation caused by charging and discharging a capacitor.

2. Description of the Related Art

In a power supply circuit such as a DC-DC converter, voltage is controlled by PWM (pulse width modulation) control. In this case, a triangle wave is generated by a triangle wave generator circuit, and a detected voltage and the triangle wave are compared so that the output is inverted based on the magnitude relationship between the detected voltage and the triangle wave, thereby generating a pulse for PWM.

FIG. 1 is a circuit diagram showing a conventional triangle wave generator circuit 10.

The triangle wave generator circuit 10 includes a comparator 11 (COMP1), a comparator 12 (COMP2), a latch circuit 13, reference voltage sources 14 and 15, a charging and discharging circuit 16, and a capacitor 17.

The inverting input terminal of the comparator 11 is connected to the reference voltage source 14 so that a reference voltage VREF1 is applied from the reference voltage source 14 to the inverting input terminal of the comparator 11. The non-inverting input terminal of the comparator 11 is connected to an output terminal $T_{out}$ so that an output triangle wave is fed from the output terminal $T_{out}$ to the non-inverting input terminal of the comparator 11. The output level of the comparator 11 is LOW when the output triangle wave is lower than the reference voltage VREF1, and is HIGH when the output triangle wave is higher than the reference voltage VREF1. The output of the comparator 11 is fed to the reset input (R) of the latch circuit 13.

The non-inverting input terminal of the comparator 12 is connected to the reference voltage source 15 so that a reference voltage VREF2 is applied from the reference voltage source 15 to the non-inverting input terminal of the comparator 12. The inverting input terminal of the comparator 12 is connected to the output terminal $T_{out}$ so that the output triangle wave is fed from the output terminal $T_{out}$ to the inverting input terminal of the comparator 12. The output level of the comparator 12 is HIGH when the output triangle wave is lower than the reference voltage VREF2, and is LOW when the output triangle wave is higher than the reference voltage VREF2. The output of the comparator 12 is fed to the set input (S) of the latch circuit 13.

The latch circuit 13 is formed of an R-S latch. The output level of the latch circuit 13 is LOW when the output of the comparator 11 switches from HIGH to LOW, and is HIGH when the output of the comparator 12 switches from HIGH to LOW. The output of the latch circuit 13 is fed to the charging and discharging circuit 16.

The charging and discharging circuit 16 includes transistors M1 through M6 and a constant current source 21. The transistors M1 and M2 form a current mirror circuit. The transistor M2 has current supply capacity four times that of the transistor M1. The transistor M2 supplies a current 4I, four times a current I flowing through the constant current source 21, to the source of the transistor M3. The drain of the transistor M3 is connected to one end of the capacitor 17.

When the output level of the latch circuit 13 is LOW, the transistor M3 turns ON so as to supply the one end of the capacitor 17 with the current 4I supplied from the transistor M2, thereby charging the capacitor 17. The other end of the capacitor 17 is connected to ground.

Likewise, the transistors M1 and M4 also form a current mirror circuit. The transistor M4 has current supply capacity twice that of the transistor M1. The transistor M4 supplies a current 2I, twice the current I flowing through the constant current source 21, to a current mirror circuit formed by the transistors M5 and M6.

The transistors M5 and M6 draw a current corresponding to the current 2I flowing through the transistor M4 from the one end of the capacitor 17, thereby discharging the capacitor 17 with the current 2I. The capacitor 17 is charged with the current 2I when the transistor M3 is ON, and is discharged with the current 2I when the transistor M3 is OFF.

FIG. 2 is an operational waveform chart of the conventional triangle wave generator circuit 10. In FIG. 2, (a) indicates the output triangle wave of the output terminal $T_{out}$, (b) indicates the output of the comparator 11, (c) indicates the output of the comparator 12, and (d) indicates the output of the latch circuit 13.

At Time t0, the triangle wave becomes higher than the reference voltage VREF1, and the output level of the comparator 11 becomes HIGH.

When the triangle wave becomes higher than the reference voltage VREF2 at Time t1, the output level of the comparator 12 switches from HIGH to LOW. As a result, the latch circuit 13 latches the output of the comparator 11 at the time, so that the output level of the latch circuit 13 switches to HIGH. When the output level of the latch circuit 13 switches to HIGH, the transistor M3 turns OFF, so that the capacitor 17 is discharged with the current 2I. As a result, the triangle wave falls.

When the capacitor 17 is discharged so that the triangle wave becomes lower than the reference voltage VREF1 at Time t2, the output of the comparator 11 switches from HIGH to LOW. When the output of the comparator 11 switches from HIGH to LOW, the latch circuit 13 is reset, so that the output level of the latch circuit 13 becomes LOW. As a result, the transistor M3 turns ON, so that the capacitor 17 is charged with the current 2I. In consequence, the triangle wave rises.

The triangle wave is formed by repeating the above-described operation.

In recent years, there has been a demand that DC-DC converters have the capability to generate different voltages. In order to realize such capability with a simple configuration, it is necessary to form multiple triangle waves of different frequencies in synchronization with each other in the DC-DC converter. However, according to the conventional triangle wave generator circuit, it is difficult to synchronize triangle waves with each other because of variations in capacitors and charging currents charging the capacitors.

SUMMARY OF THE INVENTION

Accordingly, it is a general object of the present invention to provide an oscillator circuit and an oscillation control method in which the above-described disadvantage is eliminated.

A more specific object of the present invention is to provide an oscillator circuit and an oscillation control method capable of producing multiple oscillation outputs synchronized with each other with a simple configuration.

The above objects of the present invention are achieved by an oscillator circuit including: a first oscillation part configured to output a first oscillation output by charging and discharging a first capacitor; and a second oscillation part configured to output a second oscillation output by charging and discharging a second capacitor, wherein the second oscillation part includes a phase difference detection part configured to detect a phase difference between the first oscillation output and the second oscillation output, and a charging current and discharge current control part configured to control a charging current and a discharge current of the second capacitor in accordance with the phase difference detected by the phase difference detection part so that the second oscillation output synchronizes with the first oscillation output.

The above objects of the present invention are also achieved by a method of controlling oscillation of first and second oscillation parts performing oscillation by charging and discharging first and second capacitors, respectively, the method including the steps of: (a) detecting a phase difference between charging and discharging timings of the first and second oscillation parts; and (b) controlling a charging current and a discharge current of the second capacitor in accordance with the phase difference detected in said step (a) so that outputs of the first and second oscillation parts synchronize with each other.

According to one embodiment of the present invention, in an oscillator circuit, the phase difference between the charging and discharging timings of a first oscillation part configured to perform oscillation by charging and discharging a first capacitor and a second oscillation part configured to perform oscillation by charging and discharging a second capacitor may be detected, and the charging current and the discharge current of the second capacitor may be controlled in accordance with the detected phase difference so that the oscillation output of the second oscillation part synchronizes with the oscillation output of the first oscillation part. Thereby, it is possible to obtain multiple oscillation outputs synchronizing with each other with a simple configuration.

BRIEF DESCRIPTION OF THE DRAWINGS

Other objects, features and advantages of the present invention will become more apparent from the following detailed description when read in conjunction with the accompanying drawings, in which:

FIG. 4 is a table for illustrating the operation of a phase comparator according to the embodiment of the present invention.

DETAILED DESCRIPTION OF THE PREFERRED EMBODIMENTS

A description is given, with reference to the accompanying drawings, of an embodiment of the present invention.
[Configuration]

Figure 1:
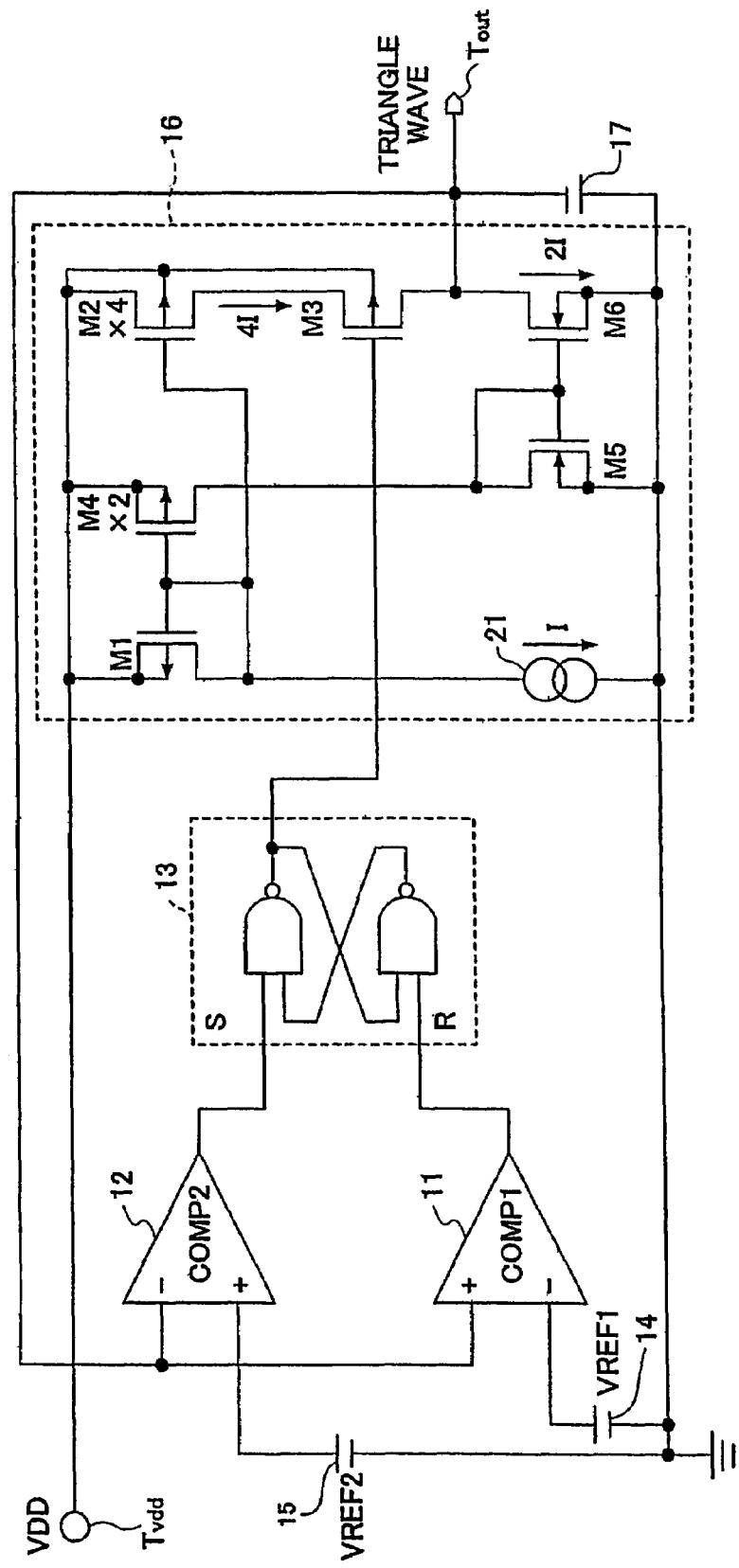
FIG. 1 is a circuit diagram showing a conventional triangle wave generator circuit.
Figure 2:
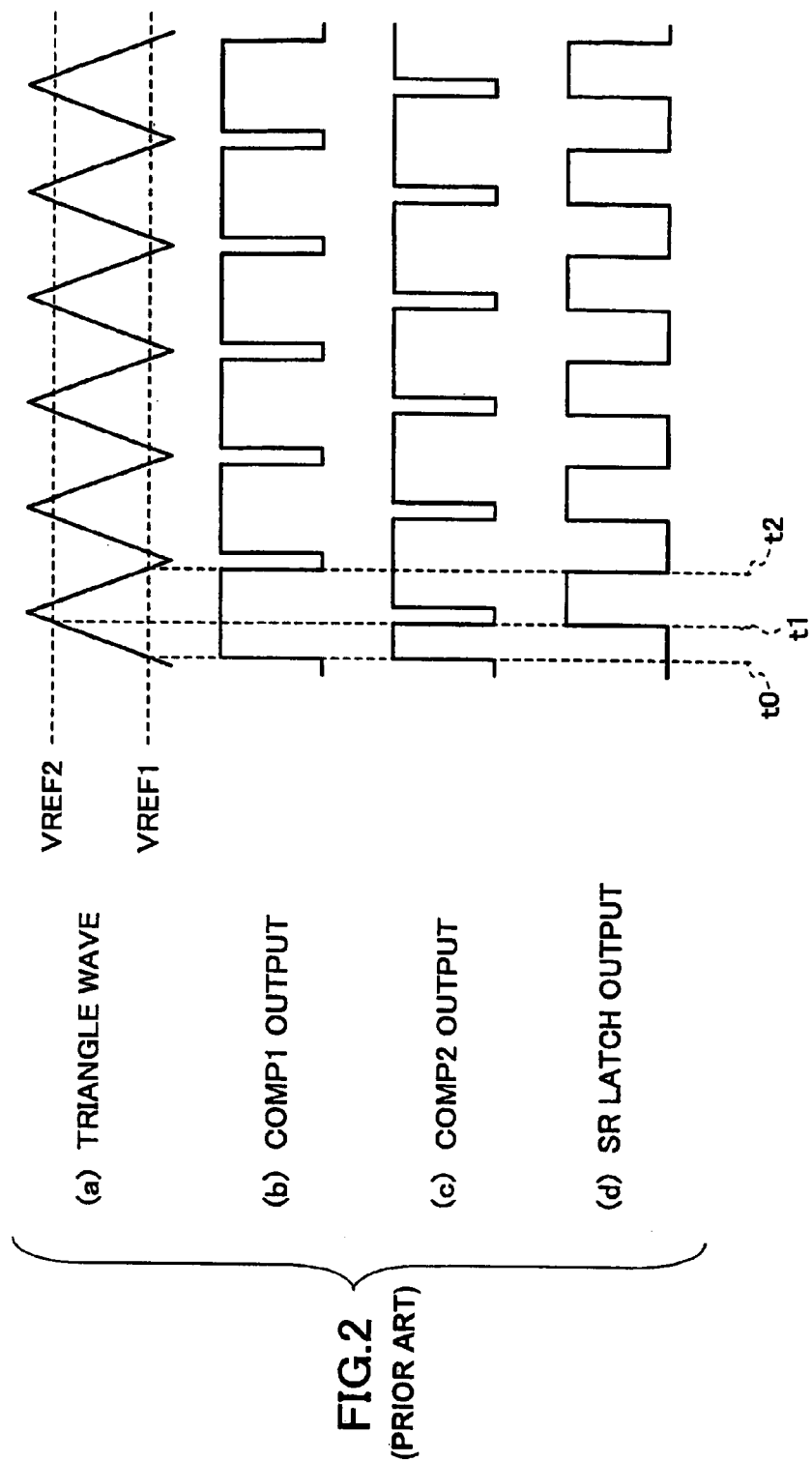
FIG. 2 is an operational waveform chart of the conventional triangle wave generator circuit.
Figure 3:
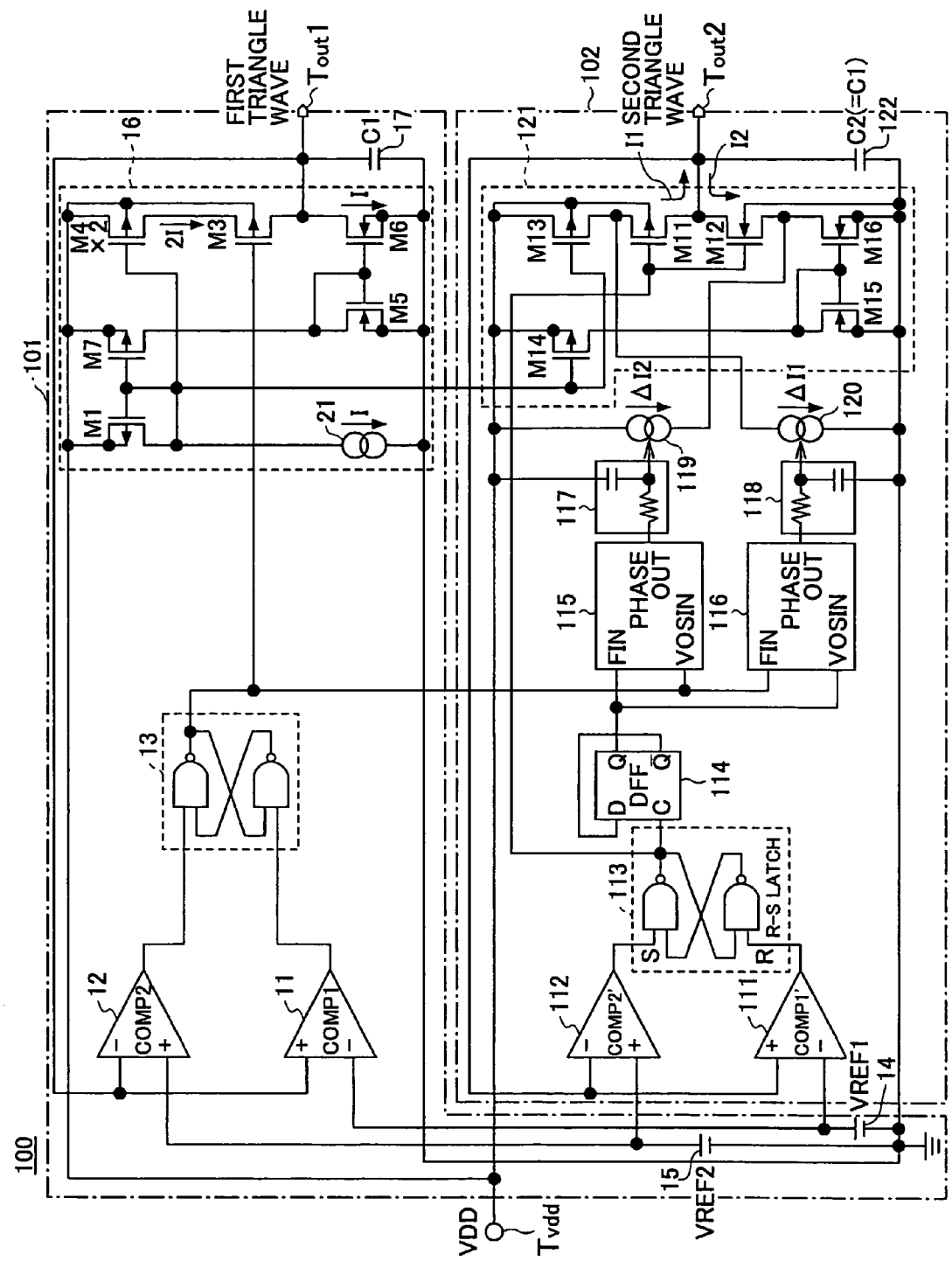
FIG. 3 is a circuit diagram showing a triangle wave generator circuit according to an embodiment of the present invention.

FIG. 3 is a circuit diagram showing a triangle wave generator circuit 100 according to the embodiment of the present invention. In FIG. 3, the same elements as those of FIG. 1 are referred to by the same numerals, and a description thereof is omitted.

In this embodiment, a description is given of the triangle wave generator circuit 100 as an example of the oscillator circuit. The triangle wave generator circuit 100 of this embodiment includes a first triangle wave generator part 101 and a second triangle wave generator part 102. The first triangle wave generator part 101 has the same configuration as the triangle wave generator circuit 10 shown in FIG. 1 except that the transistor M4 is replaced by a transistor M7 having the same current supply capacity as the transistor M1, that the transistor M2 is replaced by the transistor M4, which supplies a current 2I twice the current I to the current mirror circuit of the transistors M5 and M6, and that the transistors M5 and M6 draw a current corresponding to the current I flowing through the transistor M7 from the one end of the capacitor 17 (C1), thereby discharging the capacitor 17 with the current I.

The first triangle wave generator part 101 generates a first triangle wave. The second triangle wave generator part 102 generates a second triangle wave. The second triangle wave is synchronized with the first triangle wave and has a frequency $2^n$ times that of the first triangle wave. The second triangle wave generator part 102 includes a comparator 111 (COMP1'), a comparator 112 (COMP2'), a latch circuit 113, a D-type flip-flop (DFF) 114, phase comparators 115 and 116, smoothing circuits 117 and 118, variable current sources 119 and 120, a charging and discharging circuit 121, and a capacitor 122 (C2).

The inverting input terminal of the comparator 111 is connected to the reference voltage source 14, which forms the first triangle generator part 101. The reference voltage VREF1 is applied from the reference voltage source 14 to the inverting input terminal of the comparator 111. The non-inverting input terminal of the comparator 111 is connected to an output terminal $T_{out}2$ of the second triangle wave generator part 102 so that the output (second) triangle wave is fed from the output terminal $T_{out}2$ to the non-inverting input terminal of the comparator 111. The output level of the comparator 111 is HIGH when the second triangle wave output from the output terminal $T_{out}2$ is higher than the reference voltage VREF1, and is LOW when the second triangle wave output from the output terminal $T_{out}2$ is lower than the reference voltage VREF1. The output of the comparator 111 is fed to the reset input of the latch circuit 113.

The inverting input terminal of the comparator 112 is connected to the output terminal $T_{out}2$ of the second triangle wave generator part 102 so that the output (second) triangle wave is fed from the output terminal $T_{out}2$ to the inverting input terminal of the comparator 112. The non-inverting input terminal of the comparator 112 is connected to the reference voltage source 15, which forms the first triangle generator part 101. The reference voltage VREF2 is applied from the reference voltage source 15 to the non-inverting input terminal of the comparator 112. The output level of the comparator 112 is LOW when the second triangle wave output from the output terminal $T_{out}2$ is higher than the reference voltage VREF2, and is HIGH when the second triangle wave output from the output terminal $T_{out}2$ is lower than the reference voltage VREF2. The output of the comparator 112 is fed to the set input of the latch circuit 113.

The latch circuit 113 is formed of an R-S latch. The output level of the latch circuit 113 is reset to LOW by the falling of the output of the comparator 111, and is set to HIGH by the falling of the output of the comparator 112. The output of the latch circuit 113 is fed to the D-type flip-flop 114 as clock input, and is also fed to the charging and discharging circuit 121 as a charging and discharging control signal.

The data (D) input of the D-type flip-flop 114 is connected to the inverted (Q-bar) output of the D-type flip-flop 114. The D-type flip-flop 114 inverts its output in accordance with the output of the latch circuit 113. The non-inverted (Q) output of the D-type flip-flop 114 is fed to the phase comparator 115 as input FIN, and to the phase comparator 116 as input VOSIN. The output of the latch circuit 13 forming the first triangle wave generator part 101 is fed to the phase comparator 115 as input VOSIN, and to the phase comparator 116 as input FIN.

The phase comparator 115 outputs a pulse having a pulse width corresponding to the phase difference between the input FIN and the input VOSIN.

Figure 4:
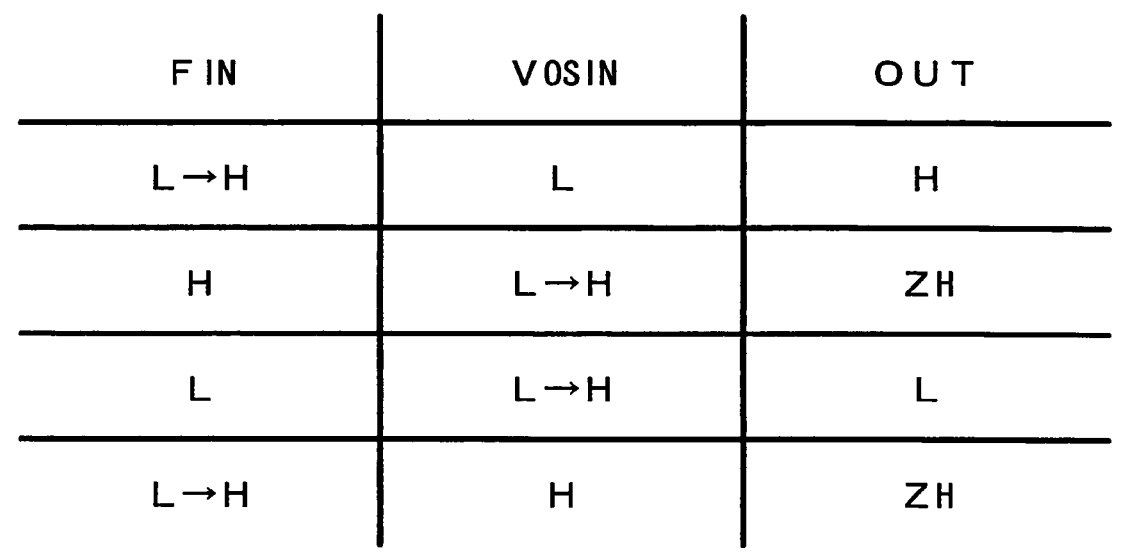

FIG. 4 is a table for illustrating the operation of the phase comparator 115.

When the level of the input FIN switches from LOW to HIGH when the level of the input VOSIN is LOW, the output level of the phase comparator 115 becomes HIGH. When the level of the input VOSIN switches from LOW to HIGH when the level of the input FIN is HIGH, the output of the comparator 115 enters the state of high impedance ZH.

Further, when the level of the input VOSIN switches from LOW to HIGH when the level of the input FIN is LOW, the output level of the comparator 115 becomes LOW. When the level of the input FIN switches from LOW to HIGH when the level of the input VOSIN is HIGH, the output of the phase comparator 115 enters the state of high impedance ZH. The phase comparator 116 operates in the same manner as the phase comparator 115. Accordingly, a description of the operation of the phase comparator 116 is omitted.

The output pulse signal of the phase comparator 115 is fed to the smoothing circuit 117. The output pulse signal of the phase comparator 116 is fed to the smoothing circuit 118.

The smoothing circuit 117 smooths the output of the phase comparator 115 on the basis of supply voltage VDD. The output of the smoothing circuit 117 is fed to the variable current source 119. The smoothing circuit 118 smooths the output of the phase comparator 116 on the basis of ground level. The output of the smoothing circuit 118 is fed to the variable current source 120.

The variable current source 119 varies its output current based on the output of the smoothing circuit 117, and feeds the output current to the charging and discharging circuit 121. The charging and discharging circuit 121 controls the discharge current of the capacitor 122 with the output current of the variable current source 119.

The variable current source 120 varies its output current based on the output of the smoothing circuit 118, and feeds the output current to the charging and discharging circuit 121. The charging and discharging circuit 121 controls the charging current of the capacitor 122 with the output current of the variable current source 120.

The charging and discharging circuit 121 includes transistors M11 through M16. The charging and discharging circuit 121 charges and discharges the capacitor 122, thereby generating the second triangle wave. The transistor M11 is formed of a p-channel MOS field-effect transistor (p-channel MOSFET). The drain of the transistor M11 is connected to the output terminal $T_{out}2$, and the source of the transistor M11 is connected to the drain of the transistor M13. The output of the latch circuit 113 is fed to the gate of the transistor M11, so that the transistor M11 is switched by the output of the latch circuit 113 so as to control the charging timing of the capacitor 122.

The transistor M12 is formed of an n-channel MOSFET. The drain of the transistor M12 is connected to the output terminal $T_{out}2$, and the source of the transistor M12 is connected to the drain of the transistor M16. The output of the latch circuit 113 is fed to the gate of the transistor M12, so that the transistor M12 is switched by the output of the latch circuit 113 so as to control the discharging timing of the capacitor 122.

The transistor M13, together with the transistor M1 forming the charging and discharging circuit 16 of the first triangle wave generator part 101, forms a current mirror circuit. The transistor M13 supplies a current I corresponding to the current I flowing through the transistor M1 to the source of the transistor M11. The current I output from the transistor M13 is supplied to the capacitor 122 when the transistor M11 is ON, and is used as the charging current of the capacitor 122.

The transistor M14, together with the transistor M1 forming the charging and discharging circuit 16 of the first triangle wave generator part 101, forms a current mirror circuit. The transistor M14 outputs a current I corresponding to the current I flowing through the transistor M1. The output current I of the transistor M14 is supplied to the transistors M15 and M16. The transistors M15 and M16 form a current mirror circuit. A current I corresponding to the current I supplied from the transistor M14 to the transistor M15 is drawn from the drain of the transistor M16. The drain of the transistor M16 is connected to the source of the transistor M12. The transistor M16 draws the current I from the capacitor 122 when the transistor M12 is ON, thereby discharging the capacitor 122.

The connection of the source of the transistor M11 and the drain of the transistor M13 is connected to the variable current source 120. The variable current source 120 draws a current $\Delta I1$ corresponding to the output of the smoothing circuit 118 from the connection of the source of the transistor M11 and the drain of the transistor M13, thereby correcting the charging current I1 of the capacitor 122. As a result, the charging current I1 of the capacitor 122 is corrected to $(I1-\Delta I1)$.

The connection of the source of the transistor M12 and the drain of the transistor M16 is connected to the variable current source 119. The variable current source 119 supplies a current $\Delta I2$ corresponding to the output of the smoothing circuit 117 to the connection of the source of the transistor M12 and the drain of the transistor M16, thereby correcting the discharge current I2 of the capacitor 122. As a result, the discharge current I2 of the capacitor 122 is corrected to $(I2-\Delta I2)$.

In this case, the outputs of the smoothing circuits 117 and 118 are signals corresponding to the phase difference between the output of the latch circuit 13 forming the first triangle wave generator part 101 and the output of the latch circuit 113 forming the second triangle wave generator part 102. By correcting the charging current I1 and the discharge current I2 of the capacitor 122 in accordance with the phase difference between the output of the latch circuit 13 forming the first triangle wave generator part 101 and the output of the latch circuit 113 forming the second triangle wave generator part 102, it is possible to synchronize the charging and discharging timing of the capacitor 122 with the charging and discharging timing of the capacitor 17 forming the first triangle wave generator part 101.

[Operations]

Figure 5:
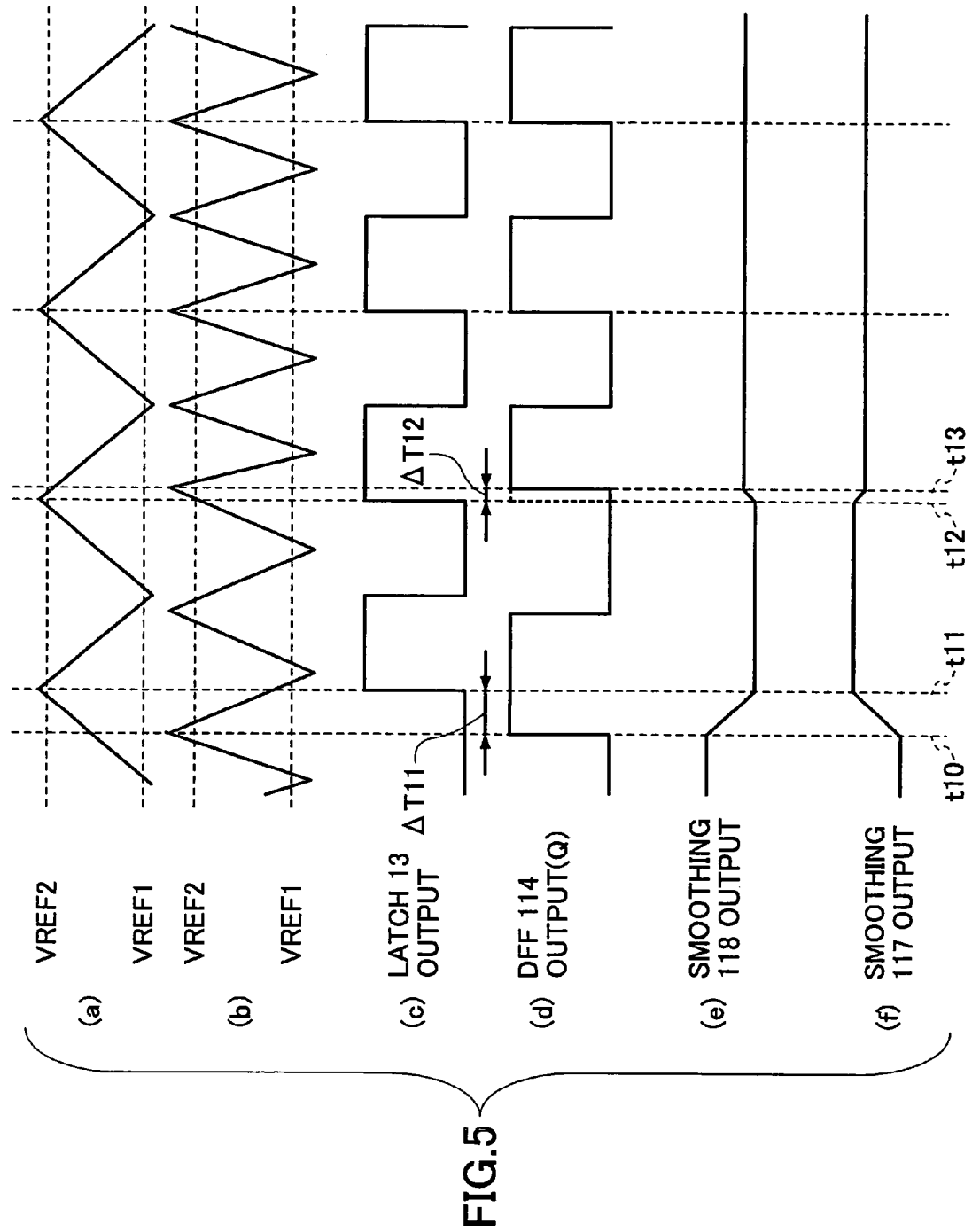
FIG. 5 is an operational waveform chart of the triangle wave generator circuit according to the embodiment of the present invention.

FIG. 5 is an operational waveform chart of the triangle wave generator circuit 100 according to this embodiment. In FIG. 5, (a) indicates the first triangle wave output from the output terminal $T_{out}1$ of the first triangle wave generator part 101, (b) indicates the second triangle wave output from the output terminal $T_{out}2$ of the second triangle wave generator part 102, (c) indicates the output of the latch circuit 13 forming the first triangle wave generator part 101, (d) indicates the output of the D-type flip-flop 114 forming the second triangle wave generator part 102, (e) indicates the output of the smoothing circuit 118, and (f) indicates the output of the smoothing circuit 117.

In the case where the output of the D-type flip-flop 114 forming the second triangle wave generator part 102 rises at Time t10 and the output of the latch circuit 13 forming the first triangle wave generator part 101 rises at Time t11 later than Time t10 by a time period ΔT11, the output level of the latch circuit 13 is LOW when the output of the D-type flip-flop 114 rises. Accordingly, the output level of the phase comparator 116 becomes LOW, and the output level of the phase comparator 115 becomes HIGH. As a result of the output level of the phase comparator 116 becoming LOW, the output of the smoothing circuit 118 decreases as shown in (e) of FIG. 5. As a result of the output level of the phase comparator 115 becoming HIGH, the output of the smoothing circuit 117 increases as shown in (f) of FIG. 5.

As a result of the decreasing output of the smoothing circuit 118, the current drawn by the variable current source 120 decreases. Further, as a result of the increasing output of the smoothing circuit 117, the current output from the variable current source 119 increases. Accordingly, the discharge current of the capacitor 122 decreases, so that the falling of the second triangle wave is delayed.

When the output of the latch circuit 13 rises at Time t11, the outputs of both phase comparators 115 and 116 become high impedance ZH. As a result, the outputs of the smoothing circuits 117 and 118 are kept in the state of Time t11.

Next, at Time t12, the output of the latch circuit 13 forming the first triangle wave generator part 101 rises earlier by a time period ΔT12 than the output of the D-type flip-flop 114 forming the second triangle wave generator part 102. The output level of the D-type flip-flop 114 is LOW when the output of the latch circuit 13 rises. Accordingly, the output level of the phase comparator 116 becomes HIGH, and the output level of the phase comparator 115 becomes LOW. As a result of the output level of the phase comparator 116 becoming HIGH, the output of the smoothing circuit 118 increases as shown in (e) of FIG. 5. As a result of the output level of the phase comparator 115 becoming LOW, the output of the smoothing circuit 117 decreases as shown in (f) of FIG. 5.

As a result of the increasing output of the smoothing circuit 118, the current drawn by the variable current source 120 increases. Further, as a result of the decreasing output of the smoothing circuit 117, the current output from the variable current source 119 decreases. Accordingly, the charging current of the capacitor 122 increases, so that the rising of the second triangle wave is advanced.

When the output of the 1 D-type flip-flop 114 rises at Time t13, the outputs of both phase comparators 115 and 116 become high impedance ZH. As a result, the outputs of the smoothing circuits 117 and 118 are kept in the state of Time t13.

Thus, by detecting the phase difference between the output triangle wave (first triangle wave) of the first triangle wave generator part 101 and the output triangle wave (second triangle wave) of the second triangle wave generator part 102, and correcting the charging current and the discharge current of the capacitor 122 in accordance with the detected phase difference, it is possible to synchronize the output triangle wave of the second triangle wave generator part 102 with the output triangle wave of the first triangle wave generator part 101.

According to one aspect of the present invention, an oscillator circuit may include a first oscillation part configured to output a first oscillation output by charging and discharging a first capacitor; and a second oscillation part configured to output a second oscillation output by charging and discharging a second capacitor, wherein the second oscillation part includes a phase difference detection part configured to detect the phase difference between the first oscillation output and the second oscillation output, and a charging current and discharge current control part configured to control the charging current and the discharge current of the second capacitor in accordance with the phase difference detected by the phase difference detection part so that the second oscillation output synchronizes with the first oscillation output.

In this configuration, the oscillator circuit may correspond to the triangle wave generator circuit 100, the first oscillation part may correspond to the first triangle wave generator part 101, the first capacitor may correspond to the capacitor 17, the second oscillation part may correspond to the second triangle wave generator part 102, the second capacitor may correspond to the capacitor 122, the phase difference detection part may correspond to the D-type flip-flop 114, the phase comparators 115 and 116, and the smoothing circuits 117 and 118, and the charging current and discharge current control part may correspond to the variable current sources 119 and 120.

According to one embodiment of the present invention, in an oscillator circuit, the phase difference between the charging and discharging timings of a first oscillation part configured to perform oscillation by charging and discharging a first capacitor and a second oscillation part configured to perform oscillation by charging and discharging a second capacitor may be detected, and the charging current and the discharge current of the second capacitor may be controlled in accordance with the detected phase difference so that the oscillation output of the second oscillation part synchronizes with the oscillation output of the first oscillation part. Thereby, it is possible to obtain multiple oscillation outputs synchronizing with each other with a simple configuration.

The present invention is not limited to the specifically disclosed embodiment, and variations and modifications may be made without departing from the scope of the present invention.

The present application is based on Japanese Priority Patent Application No. 2005-073887, filed on Mar. 15, 2005, the entire contents of which are hereby incorporated by reference.

What is claimed is:

1. An oscillator circuit, comprising:
   a first oscillation part configured to output a first oscillation output by charging and discharging a first capacitor; and a second oscillation part configured to output a second oscillation output by charging and discharging a second capacitor, wherein the second oscillation part includes a phase difference detection part configured to detect a phase difference between the first oscillation output and the second oscillation output, and a charging current and discharge current control part configured to control a charging current and a discharge current of the second capacitor in accordance with the phase difference detected by the phase difference detection part so that the second oscillation output synchronizes with the first oscillation output;

the phase difference detection part includes a phase difference comparator configured to output a signal corresponding to a phase difference between a charging and discharging timing signal of the first oscillation output and a charging and discharging timing signal of the second oscillation output; and a smoothing circuit configured to smooth an output signal of the phase difference comparator, and the charging current and discharge current control part controls the charging current and the discharge current of the second capacitor in accordance with an output of the smoothing circuit.

2. The oscillator circuit as claimed in claim 1, wherein the charging current and discharge current control part comprises:

a variable current source configured to output a current corresponding to an output of the phase difference detection part.

3. The oscillator circuit as claimed in claim 2, wherein the charging current and discharge current control part corrects the charging current and the discharge current of the second capacitor with the output current of the variable current source.

4. A method of controlling oscillation of first and second oscillation parts performing oscillation by charging and discharging first and second capacitors, respectively, the method comprising the steps of:

(a) detecting a phase difference between charging and discharging timings of the first and second oscillation parts and outputting a signal corresponding to the detected phase difference;

(b) smoothing the signal output in said step (a); and (c) controlling a charging current and a discharge current of the second capacitor in accordance with signal smoothed in said step (b) so that outputs of the first and second oscillation parts synchronize with each other.

* * * * *